(12) United States Patent
Yamazaki et al.

(10) Patent No.: US 8,294,177 B2
(45) Date of Patent: Oct. 23, 2012

(54) LIGHT EMITTING DEVICE UTILIZING A LED CHIP

(75) Inventors: Keiichi Yamazaki, Katsuragi (JP); Naoko Takei, Nagaokakyo (JP); Tomoyuki Nakajima, Kawanishi (JP)

(73) Assignee: Panasonic Corporation, Kadoma-shi (JP)

( * ) Notice: Subject to any disclaimer, the term of this patent is extended or adjusted under 35 U.S.C. 154(b) by 138 days.

(21) Appl. No.: 12/734,913

(22) PCT Filed: Dec. 5, 2008

(86) PCT No.: PCT/JP2008/072119
§ 371 (c)(1),
(2), (4) Date: Jun. 2, 2010

(87) PCT Pub. No.: WO2009/072589
PCT Pub. Date: Jun. 11, 2009

(65) Prior Publication Data
US 2010/0237375 A1    Sep. 23, 2010

(30) Foreign Application Priority Data

Dec. 7, 2007 (JP) ................ 2007-317606
Aug. 21, 2008 (JP) ................ 2008-213149
Nov. 25, 2008 (JP) ................ 2008-300175

(51) Int. Cl.
*H01L 29/24* (2006.01)
*H01L 33/00* (2010.01)
*H01L 29/20* (2006.01)
*H01L 29/201* (2006.01)
*H01L 29/22* (2006.01)
*H01L 29/227* (2006.01)
*H01L 31/0203* (2006.01)
*H01L 31/00* (2006.01)

(52) U.S. Cl. .......... 257/100; 257/89; 257/90; 257/95; 257/98; 257/99; 257/433; 257/434; 257/440; 257/E27.142; 257/E31.121; 257/E31.122; 257/E31.123; 257/E33.059; 257/E33.061; 257/E33.068; 257/E33.073; 257/E51.022

(58) Field of Classification Search .............. 257/95, 257/98, 99, E33.059, E33.061, E33.068, 257/E33.073, 89, 90, 100, 433, 434, 440, 257/E27.142, E31.121, E31.122, E31.123, 257/E51.022
See application file for complete search history.

(56) References Cited

U.S. PATENT DOCUMENTS
6,686,676 B2 * 2/2004 McNulty et al. ............ 313/112
(Continued)

FOREIGN PATENT DOCUMENTS
CN      101542753 A    9/2009
(Continued)

OTHER PUBLICATIONS

First Office Action for Chinese Patent Application No. 200880119636.0 issued Jun. 24, 2011.
(Continued)

*Primary Examiner* — Ida M Soward
(74) *Attorney, Agent, or Firm* — Edwards Wildman Palmer LLP (57) ABSTRACT

A light emitting device (1) includes a LED chip (10) as well as a mounting substrate (20) on which the LED chip (10) is mounted. Further, the light emitting device (1) includes a cover member (60) and a color conversion layer (70). The cover member (60) is formed to have a dome shape and is made of a translucency inorganic material. The color conversion layer (70) is formed to have a dome shape and is made of a translucency material (such as, a silicone resin) including a fluorescent material excited by light emitted from the LED chip (10) and emitting light longer in wavelength than the light emitted from the LED chip (10). The cover member (60) is attached to the mounting substrate (20) such that there is an air layer (80) between the cover member (60) and the mounting substrate (20). The color conversion layer (70) is superposed on a light-incoming surface or a light-outgoing surface of the cover member (60).

8 Claims, 8 Drawing Sheets

U.S. PATENT DOCUMENTS

| | | | |
|---|---|---|---|
| 6,888,173 B2 * | 5/2005 | Ishii et al. | 257/100 |
| 7,319,289 B2 * | 1/2008 | Suehiro et al. | 313/485 |
| 7,473,939 B2 * | 1/2009 | Wu et al. | 257/99 |
| 7,767,475 B2 * | 8/2010 | Masui et al. | 438/26 |
| 7,800,121 B2 * | 9/2010 | Aanegola et al. | 257/98 |
| 7,800,124 B2 * | 9/2010 | Urano et al. | 257/98 |
| 7,804,147 B2 * | 9/2010 | Tarsa et al. | 257/433 |
| 7,825,423 B2 * | 11/2010 | Shiraishi et al. | 257/98 |
| 7,842,960 B2 * | 11/2010 | Reginelli et al. | 257/98 |
| 7,893,452 B2 * | 2/2011 | Harle | 257/99 |
| 7,943,951 B2 * | 5/2011 | Kim et al. | 257/100 |
| 7,956,372 B2 * | 6/2011 | Kamada et al. | 257/98 |
| 2003/0098651 A1 * | 5/2003 | Lin et al. | 313/600 |
| 2005/0239227 A1 | 10/2005 | Aanegola et al. | |
| 2006/0012298 A1 * | 1/2006 | Lee et al. | 313/512 |
| 2006/0022582 A1 | 2/2006 | Radkov | |
| 2006/0071589 A1 | 4/2006 | Radkov | |
| 2006/0097245 A1 | 5/2006 | Aanegola et al. | |
| 2006/0181192 A1 | 8/2006 | Radkov et al. | |
| 2007/0064751 A1 | 3/2007 | Tokunaga | |
| 2007/0108461 A1 | 5/2007 | Shiraishi et al. | |
| 2007/0120135 A1 | 5/2007 | Soules et al. | |
| 2007/0241657 A1 | 10/2007 | Radkov et al. | |
| 2008/0054280 A1 | 3/2008 | Reginelli et al. | |
| 2009/0026485 A1 * | 1/2009 | Urano et al. | 257/99 |
| 2009/0267093 A1 * | 10/2009 | Kamada et al. | 257/98 |
| 2009/0295265 A1 | 12/2009 | Tabuchi et al. | |
| 2010/0155761 A1 * | 6/2010 | Ota et al. | 257/98 |

FOREIGN PATENT DOCUMENTS

| | | |
|---|---|---|
| EP | 1840977 A1 | 10/2007 |
| JP | 2004161871 A | 6/2004 |
| JP | 2005537651 T | 12/2005 |
| JP | 2006179520 A | 7/2006 |
| JP | 3978451 A | 2/2007 |
| JP | 2007059864 A | 3/2007 |
| JP | 2007080872 A | 3/2007 |
| JP | 2007088261 A | 4/2007 |
| JP | 2007-134645 A | 5/2007 |
| JP | 2007126536 A | 5/2007 |
| JP | 2007-250817 A | 9/2007 |
| JP | 2007535175 T | 11/2007 |
| JP | 2007-317952 A | 12/2007 |
| JP | 2008270707 A | 11/2008 |
| JP | 2009-141219 A | 6/2009 |

OTHER PUBLICATIONS

PCT/ISA/206 form issued in corresponding International Application No. PCT/JP2008/072119 dated Jan. 6, 2009.

International Search Report issued in corresponding International Application No. PCT/JP2008/072119 dated Mar. 31, 2009.

Japanese Examination Report issued on May 8, 2012.

* cited by examiner

LIGHT EMITTING DEVICE UTILIZING A LED CHIP

TECHNICAL FIELD

The present invention is directed to a light emitting device utilizing a LED chip (light emitting diode chip).

BACKGROUND ART

In the past, there has been proposed a light emitting device utilizing a LED chip. This kind of the light emitting device generally employs a fluorescent material excited by light emitted from the LED chip and emitting light of a color different from a color of the light emitted from the LED chip in order to light having a desired color (for example, white) by means of color mixture of light.

Figure 10:
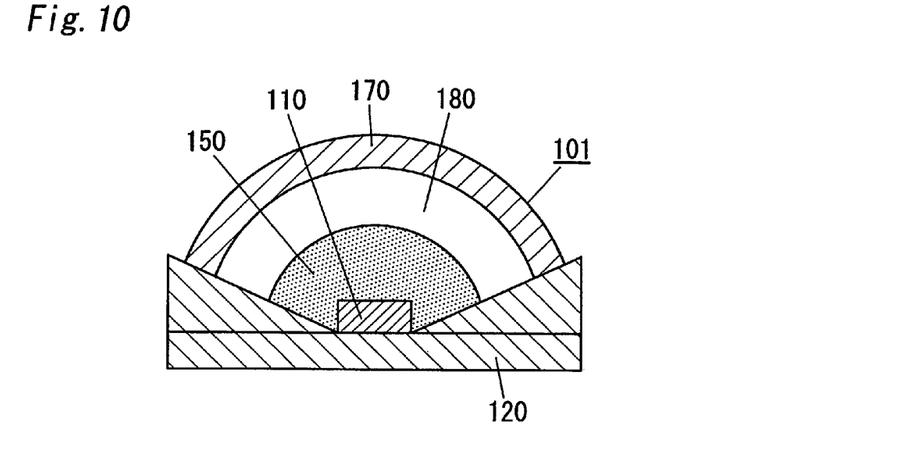
FIG. 10 is a cross-sectional view illustrating a conventional light emitting device.

For example, Japanese Patent Publication No. 3978451 discloses a light emitting device 101 shown in FIG. 10. The light emitting device 101 includes a LED chip 110, a mounting substrate 120 on which the LED chip 101 is mounted, a translucency encapsulation member 150, and a color conversion member 170. The translucency encapsulation member 150 is shaped into a semispherical shape and encapsulates the LED chip 110 on a surface of the mounting substrate 120 where the LED chip 110 is mounted. The translucency encapsulation member 150 is made of a first transparent material (e.g. silicone resin). The color conversion member 170 is shaped into a dome shape and is made of a second transparent material (e.g. silicone resin) containing a fluorescent material excited by light emitted from the LED chip 110 and emitting light longer in wavelength than the light emitted from the LED chip 110. The color conversion member 170 is secured to the mounting substrate 120 such that there is an air layer 180 interposed between the color conversion member 170 and the translucency encapsulation member 150. The above mentioned Japanese Patent Publication exemplifies a visible light LED chip together with an ultraviolet LED chip as the LED chip 110.

For example, the above mentioned light emitting device 101 is used for illumination purpose (e.g. the light emitting device 101 is used as a light source of a lighting fixture). In this instance, when an electrical current flowing through the light emitting device 101 is increased to obtain higher luminance, light or heat emitted from the fluorescent material is likely to cause time degradation to the second translucency material of the color conversion member 170, thereby reducing transmissivity of the second translucency material of the color conversion member 170. This is likely to cause some defect, such as, a defect where an amount of the light emitted from the light emitting device 101 is decreased, a defect where to lose a balance between the light emitted from the LED chip 110 and the light emitted from the fluorescent material causes a difference in chromaticity (color phase and chromaticness) between the light emitted from the LED chip 110 and the light emitted from the fluorescent material, and a defect where an operation life of the light emitting device 101 is shortened due to thermally deterioration of the color conversion member 170.

In view of above defects, it is considered to adopt not a translucency organic material (e.g. silicone resin and the like) but a translucency inorganic material (e.g. glass and the like) as the second translucency material of the color conversion layer 170. The translucency inorganic material can radiate the heat generated by the fluorescent material efficiently in comparison with the translucency organic material, because the translucency inorganic material is superior in heat conductivity to the translucency organic material. Moreover, the use of the translucency inorganic material can improve heat resistance, light resistance, and moisture resistance, in comparison with the use of the translucency organic material.

When the second translucency material is selected to be the glass, a method of manufacturing the color conversion member may comprise preparing a mixture of the glass powder of the glass and fluorescent powder of the fluorescent material, molding the mixture into a desired shape followed by baking the same.

The above method of manufacturing the color conversion member 170 enables to provide the dense color conversion member (fluorescent material dispersed glass) 170 containing less amount of air bubbles when the mold is baked at a higher temperature. In this instance, however, there is a likelihood of lowered quantum efficiency or coloring of the glass due to the fluorescent material being oxidized or reacted with the glass. While, on the other hand, the lowering of the quantum efficiency is avoided when the mold is baked at a lower temperature, however, it is likely to lower the transmissivity of the glass due to the bubbles remaining in a higher amount within the color conversion member 170.

The decrease of the quantum efficiency of the fluorescent material and the coloring of the glass are factors to cause decrease of light output of the light emitting device 101.

Therefore, development of the color conversion member 170 which can reduce the decrease of the quantum efficiency of the fluorescent material and prevent the coloring of the glass is coveted Moreover, in the light emitting device 101, it is difficult to thin a thickness of the color conversion member 170 because the color conversion member 170 is required to keep its dome shape. As the thickness of the color conversion layer 170 is increased, a difference in optical paths of the light emitted from the LED chip 110 toward various portions of the color conversion member 170 is also increased. As a result, color unevenness occurs easily.

DISCLOSURE OF INVENTION

In view of above insufficiency, the purpose of the present invention has been accomplished to provide a light emitting device capable of suppressing a rise of temperature of the fluorescent material, a thermal deterioration of the translucency material including the fluorescent material, and color unevenness.

The light emitting device in accordance with the present invention includes a LED chip and a mounting substrate on which the LED chip is mounted. The light emitting device in accordance with the present invention further includes a cover member formed to have a dome shape and made of a translucency inorganic material, and a color conversion layer formed to have a dome shape and made of a translucency material including a fluorescent material excited by light emitted from the LED chip and emitting light longer in wavelength than the light emitted from the LED chip. The cover member is attached to the mounting substrate such that there is an air layer interposed between the cover member and the mounting substrate. The color conversion layer is superposed on a light-incoming surface or a light-outgoing surface of the cover member.

Accordingly, the above mentioned light emitting device can radiate heat generated by the color conversion layer to the mounting substrate via the cover member. The light emitting device is capable of suppressing a rise of temperature of the fluorescent material, thereby being capable of increasing intensity of light. Therefore, the light emitting device is capable of suppressing a thermal deterioration of the translucency material including the fluorescent material. In addition, the color conversion layer can be thinned because the cover member keeps the dome shape of the color conversion layer. Therefore, a difference in optical paths of the light emitted from the LED chip toward various portions of the color conversion layer can be lowered to thereby to reduce color unevenness.

Preferably, the light emitting device includes a translucency encapsulation member configured to encapsulate the LED chip on a mounting surface, where the LED chip is mounted, of the mounting substrate. The air layer is interposed between the cover member and the translucency sealing member.

According to this configuration, the light emitting device can further radiate the heat generated by the color conversion layer via a path passing through the color conversion layer, the cover member, the air layer, the translucency encapsulation member, and the mounting substrate, in comparison with the light emitting device which does not include the translucency encapsulation member. Therefore, the light emitting device is capable of suppressing a rise of temperature of the color conversion layer, thereby being capable of increasing the intensity of light and suppressing the thermal deterioration of the translucency material including the fluorescent material.

More preferably, the light emitting device includes a wavelength selection filter layer configured to allow a transmission of the light emitted from the LED chip and to reflect the light emitted from the fluorescent material of the color conversion layer. The wavelength selection filter layer is formed on a light-outgoing surface of the translucency sealing member. The air layer is interposed between the cover member and the wavelength selection filter layer.

Accordingly, the light emitting device can improve light output efficiency of the color conversion layer, thereby being capable of increasing intensity of light. In addition, a stress applied to the wavelength selection filter layer caused by the heat generated by the fluorescent material of the color conversion layer can be reduced, because the air layer is interposed between the wavelength selection filter layer and the cover member. Therefore, it is possible to restrain occurrence of a crack in the wavelength selection filter layer.

Preferably, the translucency sealing member is made of glass.

Accordingly, it is possible to increase heat conductivity of the path passing through the color conversion layer, the cover member, the air layer, the translucency encapsulation member, and the mounting substrate, in comparison with the translucency encapsulation member made of an organic material such as silicone resin and the like. Therefore, it is possible to more restrain the rise of temperature of the color conversion layer.

Preferably, the preferable light emitting device includes a wavelength selection filter layer configured to allow a transmission of the light emitted from the LED chip and to reflect the light emitted from the fluorescent material of the color conversion layer. The color conversion layer is superposed on the light-outgoing surface of the cover member. The wavelength selection filter layer is superposed on the light-incoming surface of the cover member.

Accordingly, the light emitting device can improve light output efficiency of the fluorescent material of the color conversion layer, thereby being capable of increasing the intensity of light.

Preferably, the color conversion layer includes a translucency coat configured to coat the fluorescent material. The translucency coat has a refractive index in the range of a refractive index of the fluorescent material to a refractive index of the translucency material.

According to this configuration, it is possible to reduce the refractivity at the respective interfaces between the fluorescent member and the translucent material due to a correspondingly less difference of the refractivity across each interface, in contrast to a situation where the fluorescent member is in direct contact with the translucent material. Therefore, there sees an increase in an amount of the light emitting from the LED and incident into the fluorescent material, and also in an amount of the light emanating out of the fluorescent material. As a result, the light emitting device can improve light output efficiency of the color conversion layer, thereby improving light output efficiency of the device. The light emitting device can increase the intensity of light.

Preferably, the mounting substrate includes a dielectric substrate where a patterned conductor electrically connected to the LED chip is formed and a heat conductive member extending through the dielectric substrate in a thickness direction thereof. The heat conductive member is made of a material higher in heat conductivity than the dielectric substrate. The color conversion layer is thermally coupled to the heat conductive member.

Accordingly, the light emitting device can radiate the heat generated by the color conversion layer to the mounting substrate via the heat conductive member. Therefore, it is possible to restrain the rise of temperature of the color conversion layer. As a result, the intensity of light can be increased.

Preferably, the light emitting device includes a reflective member made of a material higher in reflectance than the mounting substrate. The reflective member is interposed between the mounting substrate and an edge of each of the cover member and the color conversion layer opposed to the mounting substrate.

Accordingly, the light emitting device can prevent the mounting substrate from absorbing the light emitted from the LED chip or the color conversion layer. Therefore, the light emitting device can further improve the light output efficiency of the device, thereby being capable of increasing the intensity of light.

BEST MODE FOR CARRYING OUT THE INVENTION (Embodiment 1)

Figure 1:
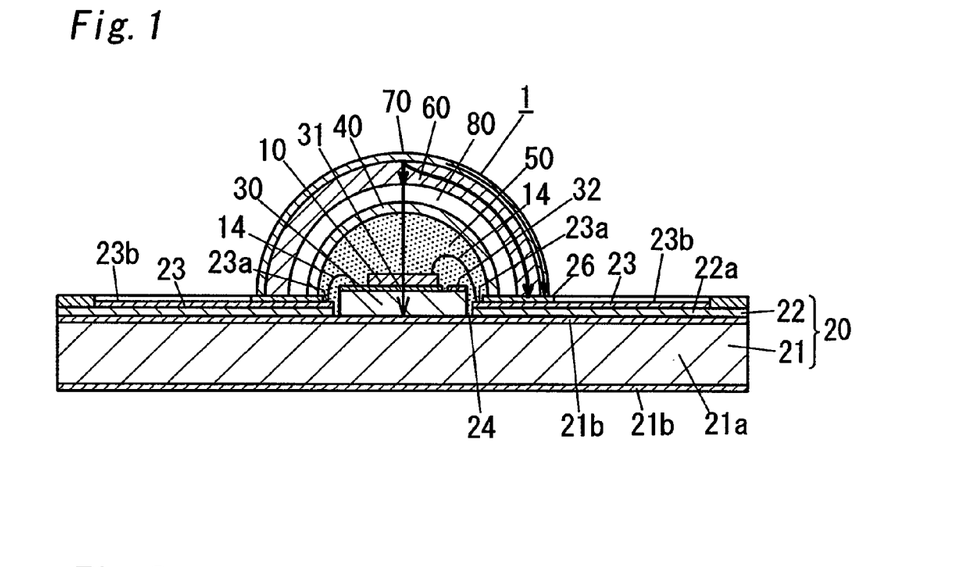
FIG. 1 is a cross-sectional view illustrating a light emitting device of embodiment 1.

There is a light emitting device 1 of the present embodiment shown in FIG. 1. The light emitting device 1 includes a LED chip 10 as well as a mounting substrate 20 where the LED chip 10 is mounted. Further, the light emitting device 1 includes a cover member 60 formed to have a dome shape and made of a translucency inorganic material, and a color conversion layer 70 formed to have a dome shape and made of a translucency material including a fluorescent material excited by light emitted from the LED chip 10 and emitting light longer in wavelength than the light emitted from the LED chip 10. The cover member 60 is attached to the mounting substrate 20 such that there is an air layer 80 interposed between the cover member 60 and the mounting substrate 20. The color conversion layer 70 is superposed on a light-outgoing surface of the cover member 60.

In addition, the light emitting device 1 includes a translucency encapsulation member 50 and an optical member 40. The translucency encapsulation member 50 encapsulates the LED chip 10 on a mounting surface, where the LED chip 10 is mounted, of the mounting substrate 20. The optical member 40 is formed to have a dome shape, and is attached to the mounting surface of the mounting substrate 20 to surround the LED chip 10. The inside of the optical member 40 is filled with the translucency encapsulation member 50. Therefore, the light emitting device 1 includes the air layer 80 interposed between the translucency encapsulation member 50 and the cover member 60 more particularly between the optical member 40 and the cover member 60. It is noted that the light emitting device 1 is not required to include the optical member 40 and the translucency encapsulation member 50.

In the light emitting device 1 of the present embodiment, the LED chip 10 is a GaN blue LED chip emitting blue light. The fluorescent material of the color conversion layer 70 is particles of a yellowish fluorescent material that emits yellow light when excited by the blue light emitted from the LED chip 10. According to the light emitting device 1 of the present embodiment, white light is obtained by mixing the yellow light emitted from the yellowish fluorescent material of the color conversion layer 70 and the blue light emitted from the LED chip 10 and passing through the translucency encapsulation member 50, the optical member 40, the air layer 80, the cover member 60, and the color conversion layer 70.

The LED chip 10 is formed with an electrode (not shown) on each of surfaces in its thickness direction. Each of the electrodes is composed of a laminated film including a Ni layer as a lower layer and an Au layer as an upper layer.

The mounting substrate 20 includes a sub-mount member 30 in the form of a rectangular plate having a first surface where the LED chip 10 is mounted, a heat conductive plate 21 in the form of a rectangular plate made of a heat conductive material, and a wiring substrate 22 formed by use of a flexible printed circuit board in the form of a rectangular plate.

The sub-mount member 30 is firmly fixed on a center of a first surface (top surface in FIG. 1) of the heat conductive plate 21. The wiring substrate 22 is firmly fixed on the first surface of the heat conductive plate 21 such that, for example, a polyolefin adhesive sheet (not shown) is interposed between the wiring substrate 22 and the heat conductive plate 21. There is a rectangular window 24 formed in a center of the wiring substrate 22 to expose the sub-mount member 30. Therefore, in the mounting substrate 20, heat generated by the LED chip 10 is transferred to the sub-mount member 30 and the heat conductive plate 21 without passing through the wiring substrate 22.

The heat conductive plate 21 consists mainly of a metal plate 21a made of coppers. The metal plate 21a is formed with a coating film 21b made of an Au film on each of surfaces in its thickness direction. The wiring substrate 22 includes a dielectric substrate 22a made of a polyimide film. There is a pair of patterned conductors 23 formed on a first surface of the dielectric substrate 22a. The patterned conductor 23 is used for supplying an electrical power to the LED chip 10. There is a resist layer 26 made of white resin and superposed on the first surface of the dielectric substrate 22a so as to cover the patterned conductors 23 as well as the first surface of the dielectric substrate 22a which is not covered with the patterned conductor 23.

A first electrode of the electrodes of the LED chip 10 is electrically connected to a first patterned conductor of the patterned conductors 23 via a bonding wire 14. A second electrode of the electrodes of the LED chip 20 is electrically connected to a second patterned conductor of the patterned conductors 23 via a patterned electrode 31 of the sub-mount member 30 and a bonding wire 14. Each of the patterned conductors 23 is formed to have a peripheral shape smaller than a half of a peripheral shape of the dielectric substrate 22a. The dielectric substrate 22a may be made of a material selected from FR4, FR5, and paper phenol.

The resist layer 26 is patterned so as to expose a portion of each of the patterned conductors 23 at a vicinity of the window 24 of the wiring substrate 22 and a portion of each of the patterned conductors 23 at a vicinity of a periphery of the wiring substrate 22. The portion of each of the patterned conductors 23 exposed at the vicinity of the window 24 is defined as a terminal portion 23a connected to the bonding wire 14. The portion of each of the patterned conductors 23 exposed at the vicinity of the periphery of the wiring substrate 22 is shaped in a circle and is defined as an electrode portion 23b used for external connection. The patterned conductors 23 of the wiring board are made of a laminated film including a Cu layer, a Ni layer, and an Au layer, and the Au layer is an uppermost layer of the laminated film.

The sub-mount member 30 is made of AlN which has relatively high thermal conductivity and electrical insulating performance. The sub-mount member 30 has a larger size than the LED chip 10. The sub-mount member 30 has a stress relief function and a heat conductive function. The stress relief function is a function which relieves a stress applied to the LED chip 10 due to a difference in linear expansion coefficient between the LED chip 10 and the heat conductive plate 21. The heat conductive function is a function which transfers the heat generated by the LED chip 10 to the heat conductive plate 21 having a larger size than the LED chip 10. Accordingly, the light emitting device 1 can relieve the stress applied to the LED chip 10 due to the difference in linear expansion coefficient between the LED chip 10 and the heat conductive plate 21, and can radiate efficiently the heat generated by the LED chip 10 through the sub-mount member 30 and the heat conductive plate 21.

The above mentioned patterned electrode 31 which is connected to the second electrode (electrode opposed to the sub-mount member 30) of the LED chip 10 is formed on the first surface of the sub-mount member 30. Further, there is a reflective film 32 formed on the first surface of the sub-mount member 30 surrounding the patterned electrode 31. The reflective film 32 is configured to reflect light emitted from a side surface of the LED chip 10. Accordingly, the reflective film 32 can prevent the sub-mount member 30 from absorbing the visible light emitted from the side surface of the LED chip 10. Moreover, in the present embodiment, the sub-mount member 30 is designed to have a thickness such that the first surface of the sub-mount member 30 is spaced from the heat conductive plate 21 by a distance greater than that between the heat conductive plate 21 and a surface of the resist layer 26 of the wiring substrate 22.

In the present embodiment, although AlN is adopted as a material of the sub-mount member 30, the material of the sub-mount member 30 is not limited to AlN, and may be selected from, for example, composite SiC, Si, and the like. The patterned electrode 31 is made of an alloy of Au and Sn containing Au as a major ingredient (such as, an alloy containing 80% Au and 20% Sn, and an alloy containing 70% Au and 30% Sn). Although Al is adopted as a material of the reflective film 32, the material of the reflective film 32 is not limited to Al, and may be selected from Ag, Ni, Au, and the like.

In the present embodiment, silicone resin is adopted as a sealant which is a material of the translucency encapsulation member 50. However, the sealant is not limited to the silicone resin and may be selected from, for example, epoxy resin, glass, and the like.

The optical member 40 is a molded component made of a translucency material (e.g. silicone resin and the like) and is shaped into a dome shape. The translucency material of the optical member 40 is preferred to be selected to decrease a difference in refractive index as well as linear expansion coefficient between the optical member 40 and the translucency encapsulation member 50. For example, in the present embodiment, the silicone resin are adopted as the sealant being the material of the translucency encapsulation member 50. Therefore, the optical member 40 is preferred to be made of the silicone resin. Likewise, the optical member 40 is preferred to be made of the epoxy resin when the epoxy resin is adopted as the sealant of the translucency encapsulation member 50, and the optical member 40 is preferred to be made of the glass when the glass is adopted as the sealant of the translucency encapsulation member 50. The optical member 40 is secured its edge (rim of an opening) adjacent to the mounting substrate 20 to the mounting substrate 20 by, for example, an adhesive (such as, silicone resin, epoxy resin, and low-melting point glass).

The translucency encapsulation member 50 is formed as follows. Firstly, the LED chip 10 is mounted on the mounting substrate 20 and is electrically connected to each of the bonding wires 14. Subsequently, the LED chip 10 and the bonding wires 14 are covered with an uncured first sealant which forms a first portion of the translucency encapsulation member 50 later on. Thereafter, the optical member 40 is positioned on the mounting substrate 20 while the optical member 40 is filled in its inside with an uncured second sealant which forms a second portion of the translucency encapsulation member 50 later on. The first sealant and the second sealant is a same material. Finally, the first sealant and the second sealant are cured to form the translucency encapsulation member 50. To form the translucency encapsulation member 50 in this way can suppress occurrence of an air void in the translucency encapsulation member 50 during a manufacturing process. It is noted that a method for forming the translucency encapsulation member 50 described in the above shows only one example and gives no limitation.

The cover member 60 is made of glass which is a translucency inorganic material. The cover member 60 is formed to have uniform thickness along a normal line for each circumferential point. The cover member 60 is secured at its edge (rim of an opening) adjacent to the mounting substrate 20 to the mounting substrate 20 by low-melting point glass or the like. The mounting substrate 20 is preferred to be made of a material having visible light reflectance of 70% or more, preferably 80% or more at a portion overlapped with the edges of the cover member 60. For example, such material can be selected from above mentioned white resin, Al, and Ag. The cover member 60 is designed to have heat conductivity higher than that of the color conversion layer 70. Accordingly, the cover member 60 can absorb heat generated by the color conversion layer 70 efficiently, and can radiate the heat to the mounting substrate 20.

The color conversion layer 70 is shaped in a dome shape and is made of the translucency material (e.g. silicone resin and the like) containing the particles of the yellowish fluorescent material that emits yellow light when excited by the blue light emitted from the LED chip 10. The color conversion layer 70 is formed to have uniform thickness along a normal line for each circumferential point, and has the thickness thinner than that of the cover member 60. The color conversion layer 70 is superposed and adhered on a light-outgoing surface of the cover member 60 so as to cover the entire light-outgoing surface. In the present embodiment, the silicone resin is adopted as the translucency material. However, the translucency material of the color conversion layer 70 is not limited to the silicone resin and may be selected from such as acrylic resin and organic-inorganic hybrid material in which an organic component and an inorganic component are mixed or combined at a molecular level or at a nanometer level.

By the way, the light emitting device 1 of the present embodiment includes the air layer 80 existing between the cover member 60 and the mounting substrate 20 (the air layer 80 is formed to be interposed between the cover member 60 and the optical member 40). Therefore, it is possible to reduce an amount of the light emitted from the LED chip 10, incident into the color conversion layer 70 through the air layer 80 and cover member 60, scattered by the fluorescent particles in the color conversion layer 70 toward the mounting substrate 20, and absorbed in the surface of the mounting substrate 20. Accordingly, the light emitting device 1 can improve a light output thereof. The light emitting device 1 can prevent that moisture contained in an atmosphere surrounding the light emitting device 1 arrives to the LED chip 10.

As explained in the above, the light emitting device 1 of the present embodiment includes the cover member 60 and the cover conversion layer 70. The cover member 60 is formed to have the dome shape and is made of the glass being the translucency inorganic material. The cover member 60 is secured to the mounting substrate 20 such that the air layer 80 is interposed between the cover member 60 and the mounting substrate 20. Meanwhile, the color conversion layer 70 is formed to have the dome shape and is made of the translucency material containing the fluorescent material excited by light emitted from the LED chip 10 and emitting the light longer in wavelength than the light emitted from the LED chip 10. The color conversion layer 70 is superposed on the light-outgoing surface, at which the light exits from the cover member 60, of the cover member 60.

Accordingly, the light emitting device 1 of the present embodiment can radiate the heat generated by the color conversion layer 70 to the mounting substrate 20 via the cover member 60. The light emitting device 1 is capable of suppressing a rise of temperature of the fluorescent material, thereby being capable of increasing intensity of light. Therefore, the light emitting device 1 is capable of suppressing a thermal deterioration of the translucency material including the fluorescent material. In addition, the color conversion layer 70 can be thinned because the cover member 60 keeps a shape (dome shape) of the color conversion layer 70. Therefore, a difference in optical paths of the light emitted from the LED chip 10 toward various portions of the color conversion layer 70 can be lowered to thereby to reduce color unevenness (color ununiformity). The light emitting device 1 of the present embodiment adopts the glass as the material of the cover member 60, thereby improving gas impermeability to water vapor or NOx as well as moisture impermeability. As a result, the light emitting device 1 can improve reliability and endurance.

As described in the above, the light emitting device 1 of the present embodiment further includes the translucency encapsulation member 50. Therefore, the light emitting device 1 can further radiate the heat generated by the color conversion layer 70 via a path passing through the color conversion layer 70, the cover member 60, the air layer 80, the translucency encapsulation member 50, and the mounting substrate 20, in comparison with the light emitting device 1 which does not include the translucency encapsulation member 50. Accordingly, the light emitting device 1 of the present embodiment is capable of suppressing a rise of temperature of the color conversion layer 70. In short, the light emitting device 1 of the present embodiment is capable of suppressing the rise of temperature of the fluorescent material, thereby being capable of increasing the intensity of light. In addition, the light emitting device 1 is capable of suppressing the thermal deterioration of the translucency material including the fluorescent material.

The translucency encapsulation member 50 made of the glass increases heat conductivity of the path passing through the color conversion layer 70, the cover member 60, the air layer 80, the translucency encapsulation member 50, and the mounting substrate 20, in comparison with the translucency encapsulation member 50 made of an organic material such as silicone resin and the like. Accordingly, the light emitting device 1 of the present embodiment is capable of more suppressing the rise of temperature of the color conversion layer 70. Although an arrow in FIG. 1 indicates a heat transmission path of heat generated by the fluorescent material contained in the color conversion layer 70, the heat generated by the fluorescent material contained in the color conversion layer 70 is radiated by radiation to atmosphere or convective flow in addition to the path indicated by the arrow.

In the light emitting device 1 of the present embodiment, the color conversion layer 70 may include a translucency coat configured to coat the fluorescent material. In this instance, the translucency coat is preferred to be made of a material (e.g. $SiO_2$ and the like) having a refractive index in the range of a refractive index of the fluorescent material to a refractive index of the translucency material (e.g. silicone resin and the like). With this configuration, it is possible to reduce the refractivity at the respective interfaces between the fluorescent member and the translucent material due to a correspondingly less difference of the refractivity across each interface, in contrast to a situation where the fluorescent member is in direct contact with the translucent material. As a result, the light emitting device 1 can improve light output efficiency of the color conversion layer 70, thereby improving light output efficiency of the device. The light emitting device 1 can increase the intensity of light.

The translucency coat made of $SiO_2$ or the like can be formed by means of a well-known formation method such as a sol-gel method and sputtering. For example, the translucency coat made of $SiO_2$ is preferred to be formed by means of the sol-gel method. A following explanation is made to forming the translucency coat made of $SiO_2$ by the use of the sol-gel method. Firstly, the fluorescent material, an organosilane compound, and water are added into an organic solvent such as methanol and mixed in order to prepare sol. Next, the resultant sol is added a catalyst to and heated to promote hydrolysis and condensation reaction. As a result, the translucency coat made of $SiO_2$ is formed on a surface of the fluorescent material. It is noted that a material of the translucency coat can be appropriately selected in accordance with the refractive index of each of the fluorescent material and the translucency material. For example, the material of the translucency coat may be selected from an organic material (e.g. silicone resin and the like) and an inorganic material (such as $SiO_2$, $Al_2SO_3$, and $Y_2O_3$). Further, a method of forming of the translucency coat is preferred to be selected in accordance with the material of the translucency coat.

(Embodiment 2)

Figure 2:
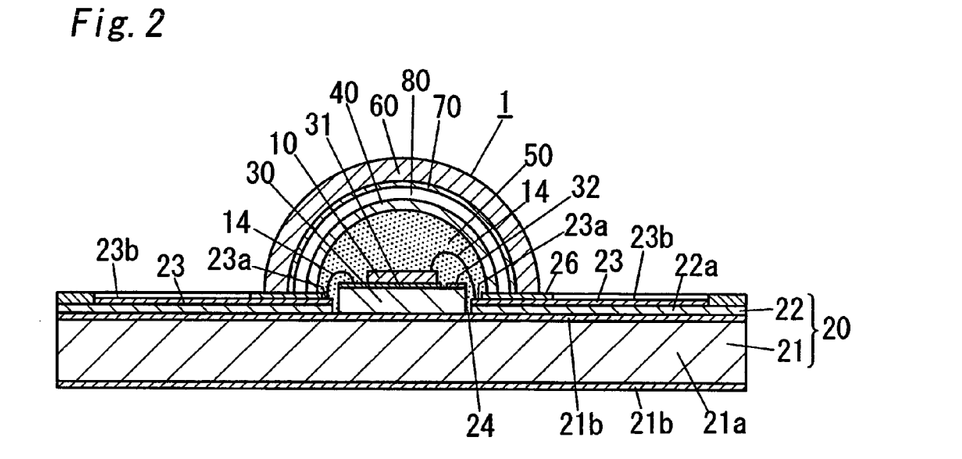
FIG. 2 is a cross-sectional view illustrating a light emitting device of embodiment 2.

As shown in FIG. 2, the light emitting device 1 of the present embodiment is different from the light emitting device 1 of the embodiment 1 in that the color conversion layer 70 is superposed on a light-incoming surface, at which the light enters into the cover member 60, of the cover member 60 and the air layer 80 is formed to be interposed between the optical member 40 and the color conversion layer 70. The light emitting device 1 of the present embodiment has a basic structure similar to the embodiment 1. Therefore like parts are designated by like reference numerals and dispensed with duplicate explanations.

In the light emitting device 1, as described in the above, the color conversion layer 70 is superposed on the light-incoming surface of the cover member 60 and the air layer 80 is formed to be interposed between the optical member 40 and the color conversion layer 70. Therefore, the color conversion layer 70 can be protected with the cover member 60.

Accordingly, the light emitting device 1 of the present embodiment is capable of suppressing hygroscopic deterioration of the fluorescent material of the color conversion layer 70, in comparative with the light emitting device 1 of the embodiment 1 where the color conversion layer 70 is superposed on the light-outgoing surface of the cover member 60.

(Embodiment 3)

Figure 3:
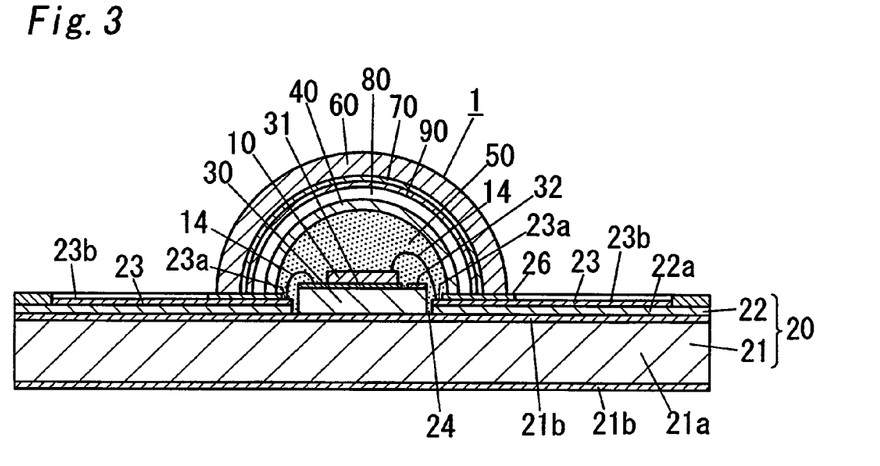
FIG. 3 is a cross-sectional view illustrating a light emitting device of embodiment 3.

As shown in FIG. 3, the light emitting device 1 of the present embodiment is different from the light emitting device 1 of the embodiment 2 in that there is a translucency material layer 90 superposed on the color conversion layer 70 superposed on the light-incoming surface of the cover member 60 and the air layer 80 is formed to be interposed between the optical member 40 and the translucency material layer 90. The light emitting device 1 of the present embodiment has a basic structure similar to the embodiment 2. Therefore like parts are designated by like reference numerals and dispensed with duplicate explanations.

The translucency material layer 90 is, for example, made of a translucency inorganic material (e.g. glass and the like). The translucency material layer 90 is superposed on the color conversion layer 70 so as to cover an entire surface of the color conversion layer 70 opposite to the cover member 60.

Accordingly, the light emitting device 1 of the present embodiment can radiate the heat generated by the color conversion layer 70 to the mounting substrate 20 via the translucency material layer 90. Therefore, in comparison with the embodiment 2, the light emitting device 1 can increase the number of the heat transmission path of the heat generated by the fluorescent material contained in the color conversion layer 70, thereby improving heat radiation performance.

(Embodiment 4)

Figure 4:
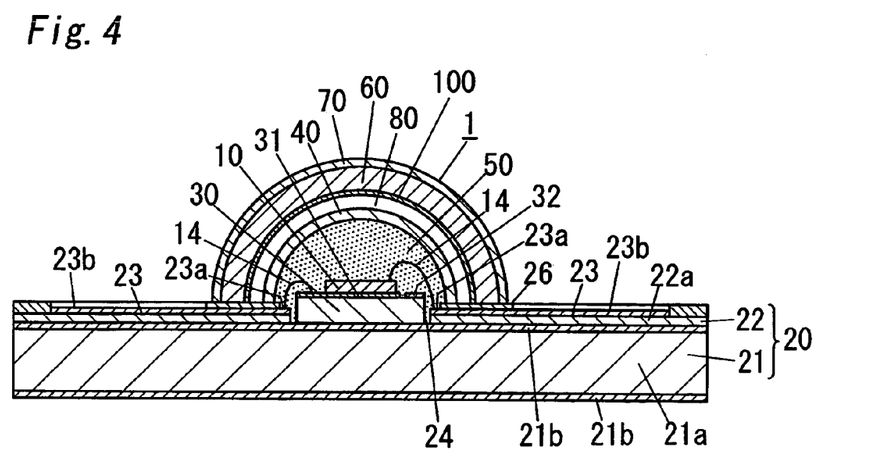
FIG. 4 is a cross-sectional view illustrating a light emitting device of embodiment 4.

As shown in FIG. 4, the light emitting device 1 of the present embodiment is different from the light emitting device 1 of the embodiment 1 in that the light emitting device 1 includes a wavelength selection filter layer 100. The light emitting device 1 of the present embodiment has a basic structure similar to the embodiment 1. Therefore like parts are designated by like reference numerals and dispensed with duplicate explanations.

The wavelength selection filter layer 100 is configured to allow a transmission of the light emitted from the LED chip 10 and to reflect the light emitted from the fluorescent material of the color conversion layer 70. The wavelength selection filter 100 is an optical multilayer film formed by interlaminating a first dielectric film made of a high refractive index material having a relatively high refractive index and a second dielectric film made of a low refractive index material having a relatively low refractive index. The high refractive index material is selected from, for example, $Ta_2O_5$, $TiO_2$, and the like. The low refractive index material is selected from, for example, $SiO_2$, $MgF_2$, and the like. The above mentioned first dielectric layer and second dielectric layer can be easily formed by means of thin-film formation technique such as ion plating, ion-beam assisted deposition, and radical-assisted sputtering. Using the above mentioned optical multilayer film as the wavelength selection filter layer 100 can improve endurance of the wavelength selection filter layer 100.

It is noted that the high refractive index material and the low refractive index material are not limited to above mentioned materials. The number or a thickness of each of dielectric films (the first dielectric film and the second dielectric film) can be appropriately selected in accordance with, such as, the refractive index of the cover member 60 contacting to the wavelength selection filter layer 100, the refractive index of each of the dielectric films, and a cutoff wavelength of the wavelength selection filter layer 100 between an emission peak wavelength of the LED chip 10 and an emission peak wavelength of the fluorescent material of the color conversion layer 70.

The wavelength selection filter layer 100 is superposed on the light-incoming surface of the cover member 60 so as to cover the entire light-incoming surface. Therefore, in the light emitting device 1 of the present embodiment, the air layer 80 is formed to be interposed between the wavelength selection filter 100 and the optical member 40.

In the above explained light emitting device 1 of the present embodiment, the color conversion layer 70 is superposed on the light-outgoing surface of the cover member 60, and the wavelength selection filter layer 100 is superposed on the light-incoming surface of the cover member 60. Therefore, the light emitting device 1 can improve the light output efficiency of the color conversion layer 70, thereby being capable of increasing the intensity of light.

Moreover, in the light emitting device 1 of the present embodiment, the air layer 80 is formed to be interposed between the optical member 40 and the wavelength selection filter layer 100 shaped into a dome shape. Accordingly, the light emitting device 1 of the present embodiment can reduce incident angle dependence of spectroscopic characteristics of a filter realized by the wavelength selection filter layer 100, in comparison with the light emitting device 1 where a medium between the wavelength selection filter layer 100 and the optical member 40 is made of a translucency material (e.g. silicone resin and the like). Therefore, the light emitting device 1 can improve the light output efficiency of the device 1, and can reduce the color unevenness.

(Embodiment 5)

Figure 5:
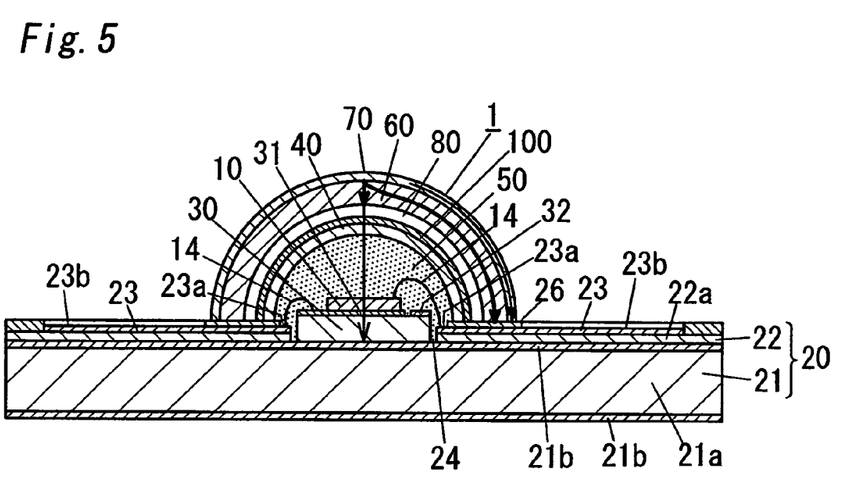
FIG. 5 is a cross-sectional view illustrating a light emitting device of embodiment 5.

As shown in FIG. 5, the light emitting device 1 of the present embodiment is different from the light emitting device 1 of the embodiment 4 in a location of the wavelength selection filter layer 100. The light emitting device 1 of the present embodiment has a basic structure similar to the embodiment 4. Therefore like parts are designated by like reference numerals and dispensed with duplicate explanations.

In the light emitting device 1 of the present embodiment, the wavelength selection filter layer 100 is formed on a light-outgoing surface of the translucency encapsulation member 50, and more particularly the wavelength selection filter layer 100 is directly formed on a light-outgoing surface of the optical member 40. Therefore, in the light emitting device 1 of the present embodiment, the air layer 80 is formed to be interposed between the wavelength selection filter layer 100 and the cover member 60.

As described in the above, the light emitting device 1 of the present embodiment, likewise the embodiment 4, includes the wavelength selection filter layer 100. Therefore, likewise the embodiment 4, the light emitting device 1 of the present embodiment can improve the light output efficiency of the color conversion layer 70, thereby being capable of increasing the intensity of light.

By the way, in the light emitting device 1 of the embodiment 4, the wavelength selection filter layer 100 is superposed on the cover member 60. Accordingly, there is a concern that the heat is generated by the fluorescent material in the color conversion layer 70 to apply a stress to the wavelength selection filter layer 100, which may cause a crack in the wavelength selection filter layer 100 to reduce the light output efficiency.

By contrast, in the light emitting device 1 of the present embodiment, the air layer 80 is interposed between the wavelength selection filter layer 100 and the cover member 60. Therefore, the stress applied to the wavelength selection filter layer 100 caused by the heat generated by the fluorescent material of the color conversion layer 70 can be reduced. As a result, the light emitting device 1 of the present embodiment can suppress an occurrence of the crack in the wavelength selection filter layer 100.

Moreover, in the present embodiment, the color conversion layer 70 is superposed on the light-outgoing surface of the cover member 60. However, likewise the embodiments 2 and 3, the color conversion layer 70 may be superposed on the light-incoming surface of the cover member 60 in the present embodiment. Further, in the present embodiment, the wavelength selection filter layer 100 is superposed on the light-outgoing surface of the optical member 40. However, the light emitting device 1 of the present embodiment may be constituted without the optical member 40. In this instance, the wavelength selection filter layer 100 may be superposed on the light-outgoing surface of the translucency encapsulation member 50.

(Embodiment 6)

Figure 6A:
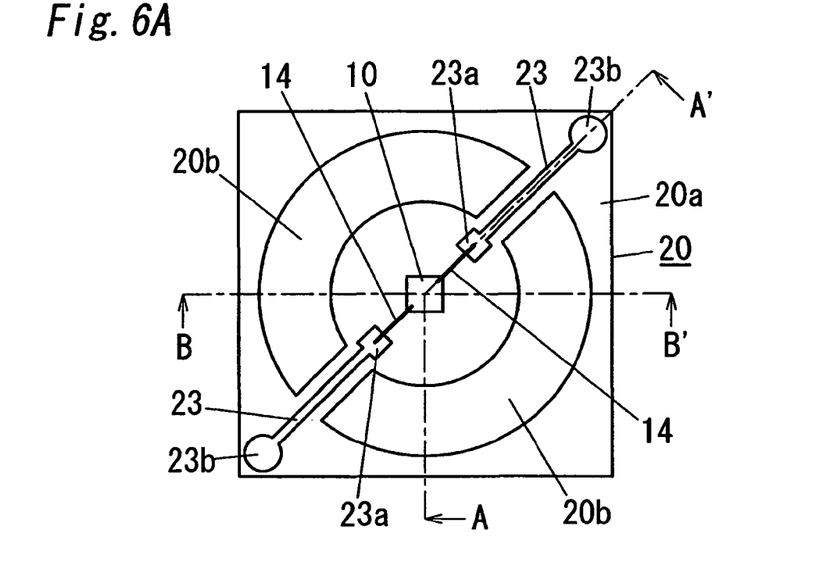
FIG. 6A is a plane view illustrating a principle part of a light emitting device of embodiment 6.
Figure 6B:
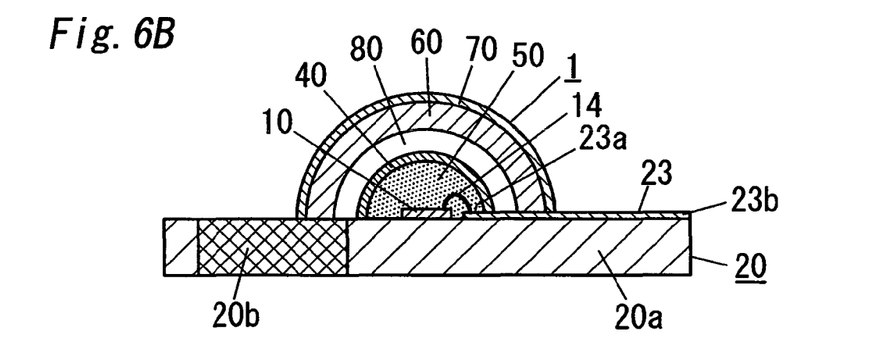
FIG. 6B is a cross-sectional view illustrating the light emitting device of the embodiment 6 in relation to a cross-sectional view along the line A-A' of FIG. 6A.
Figure 6C:
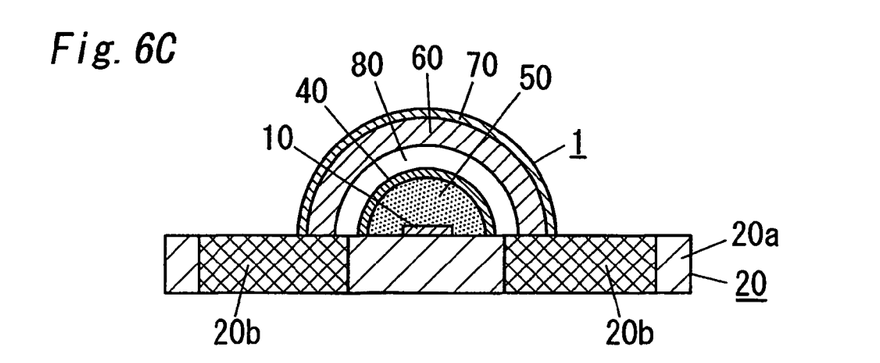
FIG. 6C is a cross-sectional view illustrating the light emitting device of the embodiment 6 in relation to a cross-sectional view along the line B-B' of FIG. 6A.

As shown in FIG. 6, the light emitting device 1 of the present embodiment is mainly different from the light emitting device 1 of the embodiment 1 in that a construction of the mounting substrate 20. The light emitting device 1 of the present embodiment has a basic structure similar to the embodiment 1. Therefore like parts are designated by like reference numerals and dispensed with duplicate explanations.

The mounting substrate 20 of the present embodiment is composed of a dielectric substrate 20a and heat conductive members 20b. For example, the dielectric substrate 20a is selected from a ceramic substrate which has relatively high thermal conductivity and electrical insulating performance (e.g. an alumina substrate, an aluminum nitride substrate, and the like), a porcelain enamel substrate, and a silicon substrate formed with a silicon dioxide film on its surface. The patterned conductors 23 are formed on the dielectric substrate 20a and are connected to the LED chip 10. The heat conductive members 20b extend through the dielectric substrate 20a in a thickness direction thereof. The heat conductive member 20b is made of a material (e.g. metallic material having relatively high heat conductivity such as Cu) higher in heat conductivity than the dielectric substrate 20a.

The LED chip 10 of the present embodiment is formed with each of the electrodes on a first surface of the surfaces in its thickness direction. The electrodes of the LED chip 10 are connected to the terminal portions 23a via the bonding wires 14, respectively.

The color conversion layer 70 is superposed on the cover member 60 such that at least one portion of the color conversion layer 70 is contacted to the heat conductive members 20b. The above mentioned portion of the color conversion layer 70 is, for example, a portion of an edge (rim of an opening) of the color conversion layer 70 opposed to the mounting substrate 20. Briefly, in the light emitting device 1 of the present embodiment, the color conversion layer 70 is thermally coupled to the heat conductive members 20b.

As described in the above, since the color conversion layer 70 is thermally coupled to the heat conductive members 20b, the light emitting device 1 of the present embodiment can radiate the heat generated by the color conversion layer 70 to the mounting substrate 20 via the heat conductive members 20b. Therefore, the rise of temperature of the color conversion layer 70 can be more suppressed. As a result, the intensity of light can be increased. In the present embodiment, the light emitting device 1 includes the LED chip 10 formed with each of the electrodes on the first surface of the surfaces in its thickness direction. Alternatively, likewise the embodiment 1, the light emitting device 1 may include the LED chip 10 formed with the electrode on each of the surfaces in its thickness direction. In this instance, one of the patterned conductors 23 may be designed to have a portion utilized as a die pad connecting to the LED chip 10.

(Embodiment 7)

Figure 7A:
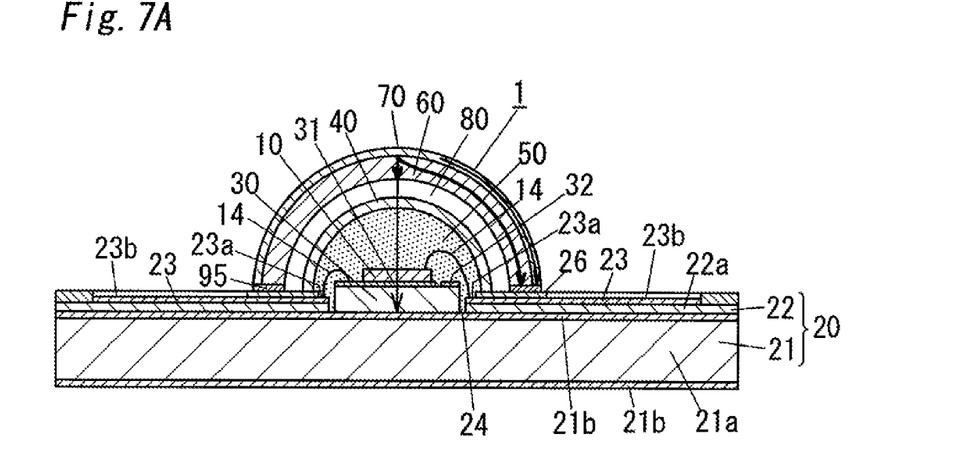
FIG. 7A is a cross-sectional view illustrating a light emitting device in accordance with embodiment 7.
Figure 7B:
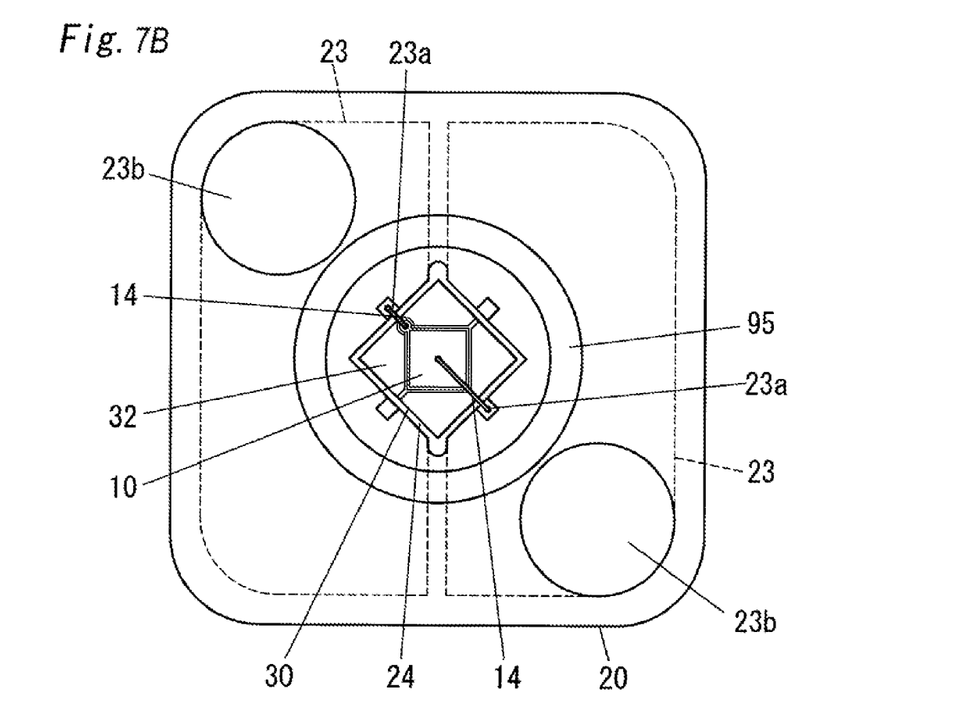
FIG. 7B is a plane view illustrating a principle part of the light emitting device in accordance with the embodiment 7.

As shown in FIG. 7, the light emitting device 1 of the present embodiment is different from the light emitting device 1 of the embodiment 1 in that the light emitting device 1 includes a reflective member 95. The light emitting device 1 of the present embodiment has a basic structure similar to the embodiment 1. Therefore like parts are designated by like reference numerals and dispensed with duplicate explanations.

The reflective member 95 is configured to reflect the light emitted from the LED chip 10 as well as the light emitted from the fluorescent material of the color conversion layer 70. In the present embodiment, as shown in FIG. 7, the reflective member 95 is interposed between the mounting substrate 20 and the edge of each of the cover member 60 and the color conversion layer 70 opposed to the mounting substrate 20.

In addition, the reflective member 95 is, for example, made of a material higher in reflectance than the mounting substrate. Particularly, the material of the reflective member 95 is preferred to have visible light reflectance of 80% or more, preferably 90% or more.

The material of the reflective member 95 can be selected from a metallic material (e.g. Al, Ag, Al alloy, Ag alloy, and the like) and a white inorganic material (e.g. $BaSO_4$ and the like). When the metallic material is adopted as the material of the reflective member 95, the reflective member 95 may be formed as follows. That is, the reflective member 95 is formed on either the edge of each of the cover member 60 and the color conversion layer 70 or a first surface of the mounting member 20 (in the present embodiment, a first surface of the resist layer 26), by means of sputtering, vapor deposition, or the like. When the white inorganic material is adopted as the material of the reflective member 95, the reflective member 95 may be formed as follows. That is, the reflective member 95 is formed by coating the edge of each of the cover member 60 and the color conversion layer 70 or the first surface of the mounting member 20 (in the present embodiment, a first surface of the resist layer 26) with powder of the inorganic material (e.g. $BaSO_4$) mixed with a binder made of a translucent material (e.g. a translucent organic material such as silicone resin, or the translucent inorganic material such as glass).

The above mentioned light emitting device 1 of the present embodiment can prevent the mounting substrate 20 from absorbing the light emitted from the LED chip 10 or the color conversion layer 70. Therefore, the light emitting device 1 can further improve the light output efficiency of the device 1, thereby being capable of increasing the intensity of light. At least, the reflective member 95 may be interposed between the mounting substrate 20 and the edge of each of the cover member 60 and the color conversion layer 70 adjacent to the mounting substrate 20. The reflective member 95 may extend beyond the color conversion layer 70 on the first surface of the mounting substrate 20. The reflective member 95 may be formed to cover the almost entire resist layer 26 outside the color conversion layer 70. When the reflective member 95 is made of the metallic material, the reflective member 95 has electrical conductivity. Accordingly, the reflective member 95 is required to be kept from a vicinity of the electrode portion 23b in order to prevent the reflective member 95 and the electrode portion 23b from short-circuiting.

(Embodiment 8)

Figure 8:
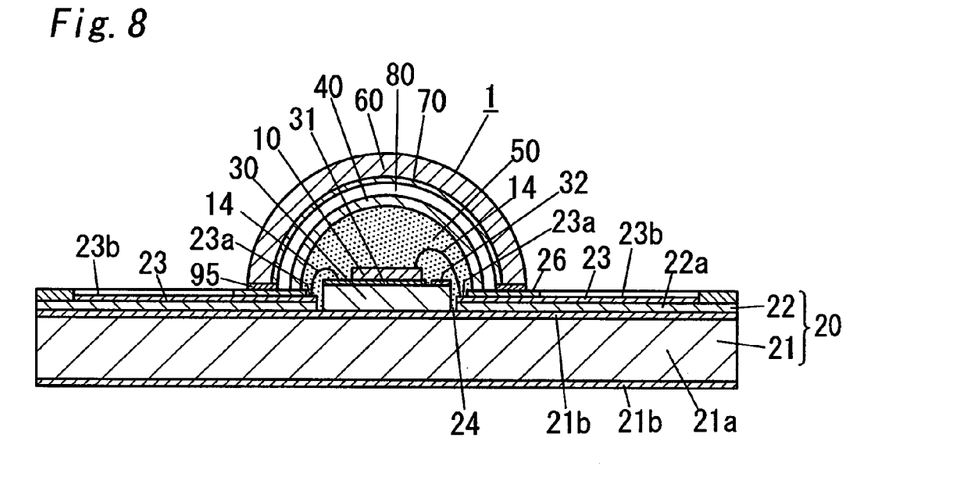
FIG. 8 is a cross-sectional view illustrating a light emitting device in accordance with embodiment 8.

As shown in FIG. 8, the light emitting device 1 of the present embodiment is different from the light emitting device 1 of the embodiment 2 in that the light emitting device 1 includes the reflective member 95 similar to that of the embodiment 7. The light emitting device 1 of the present embodiment has a basic structure similar to the embodiment 2. Therefore like parts are designated by like reference numerals and dispensed with duplicate explanations.

Accordingly, the light emitting device 1 of the present embodiment also can prevent the mounting substrate 20 from absorbing the light emitted from the LED chip 10 or the color conversion layer 70. Therefore, the light emitting device 1 can further improve the light output efficiency of the device 1, thereby being capable of increasing the intensity of light. It is noted that the reflective member 95 can be provided to the light emitting device of each of the embodiments 3, 4, and 5.

(Embodiment 9)

Figure 9A:
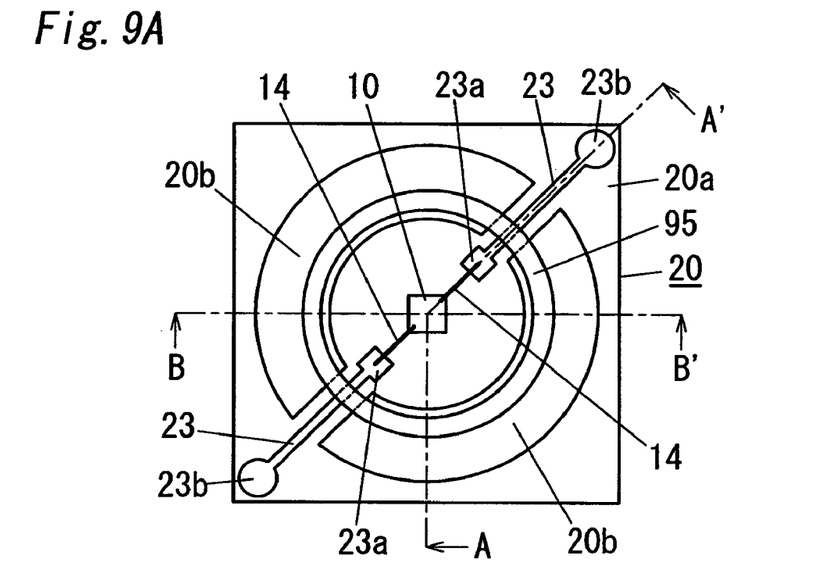
FIG. 9A is a plane view illustrating a principle part of a light emitting device of embodiment 9.
Figure 9B:
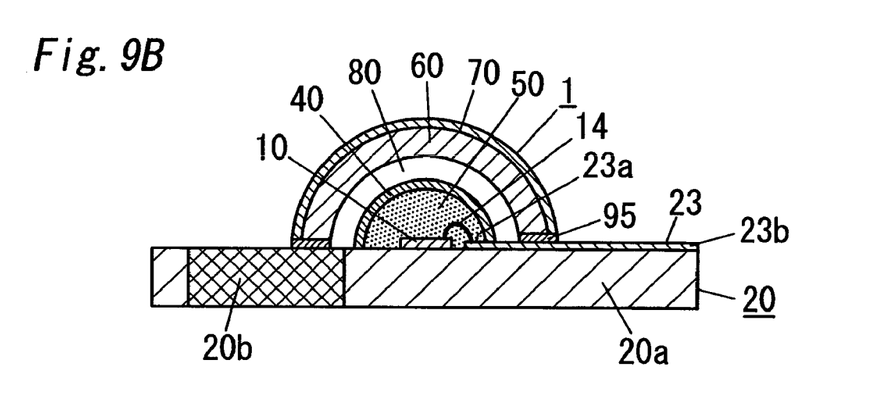
FIG. 9B is a cross-sectional view illustrating the light emitting device of the embodiment 9 in relation to a cross-sectional view along the line A-A' of FIG. 9A.
Figure 9C:
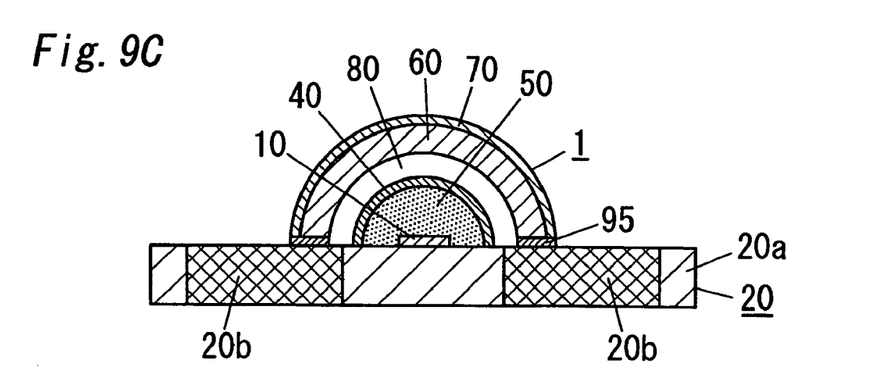
FIG. 9C is a cross-sectional view illustrating the light emitting device of the embodiment 9 in relation to a cross-sectional view along the line B-B' of FIG. 9A.

As shown in FIG. 9, the light emitting device 1 of the present embodiment is different from the light emitting device 1 of the embodiment 6 in that the light emitting device 1 includes the reflective member 95 similar to that of the embodiment 7. The light emitting device 1 of the present embodiment has a basic structure similar to the embodiment 6. Therefore like parts are designated by like reference numerals and dispensed with duplicate explanations.

In the light emitting device 1 of the present embodiment, the reflective member 95 is formed so as to be superposed on the heat conductive member 20b made of the metallic material (e.g. Cu and the like) having relatively high heat conductivity of the mounting substrate 20. Therefore, the material of the reflective member 95 is selected from $BaSO_4$ and the like. It is noted that Cu has a reflectance of about 60% for light of wavelength 500 nm and a reflectance of about 60% for blue light.

Accordingly, the light emitting device 1 of the present embodiment also can prevent the mounting substrate 20 from absorbing the light emitted from the LED chip 10 or the color conversion layer 70. Therefore, the light emitting device 1 can further improve the light output efficiency of the device 1, thereby being capable of increasing the intensity of light.

Although each of the above mentioned embodiments 1 to 9 adopts the blue LED chip having emission color of blue as the LED chip 10, the light emitted from the LED chip 10 is not limited to the blue light, and may be selected from such as red light, green light, purple light, and ultraviolet light. The fluorescent material of the color conversion layer 70 is not limited to the yellowish fluorescent material, and the color conversion layer 70 may contain a plurality of the different fluorescent materials for the purpose of color coordination, improvement of color rendering properties, or the like. For example, to use a reddish fluorescent material and a greenish fluorescent material enables to obtain the white light having relatively high color rendering properties. When using plural kinds of fluorescent materials, it is not necessarily limited to a combination of the plural kinds of fluorescent materials having different emission colors, but also possible to use a combination of plural kinds of fluorescent materials having the like yellowish emission colors but with different spectra, for example. Although each of the above mentioned embodiments 1 to 9 exemplifies the light emitting device 1 including one LED chip 10, the number of the LED chip 10 is not limited particularly. For example, the light emitting device 1 may adopt a configuration where a plurality of the LED chips 10 is mounted on one mounting substrate 20 and one translucency encapsulation member 50 encapsulates the plurality of the LED chips 10.

The light emitting device 1 of each of the above mentioned embodiments 1 to 5, 7, and 8 adopts the LED chip 10 formed with the electrode on each of the surfaces in its thickness direction. Likewise the embodiments 6 and 9, the light emitting device 1 of each of the embodiments 1 to 5, 7, and 8 may adopt the LED chip 10 formed with each of the electrodes on the first surface of the surfaces in its thickness direction. In this instance, the electrodes of the LED chip 10 can be connected to the terminal portions 23a via the bonding wires 14, respectively. The light emitting device 1 of each of the above mentioned embodiments 1 to 5, 7, and 8 includes the sub-mount member 30 interposed between the LED chip 10 and the heat conductive plate 21. However, when the difference in linear expansion coefficient between the LED chip 10 and the heat conductive plate 21 is relatively small, the sub-mount member 30 is not indispensable.

The invention claimed is:

1. A light emitting device comprising:
a LED chip;
a mounting substrate on which said LED chip is mounted;
a cover member formed to have a dome shape and made of a translucency inorganic material; and
a color conversion layer formed to have a dome shape and made of a translucency material including a fluorescent material excited by light emitted from said LED chip and emitting light longer in wavelength than the light emitted from said LED chip,
wherein said cover member is attached to said mounting substrate such that there is an air layer between said cover member and said mounting substrate, and
wherein said color conversion layer is superposed on a light-incoming surface or a light-outgoing surface of said cover member.

2. A light emitting device as set forth in claim 1, wherein said light emitting device comprises a translucency encapsulation member configured to encapsulate said LED chip on a mounting surface, where said LED chip is mounted, of said mounting substrate,
said air layer being interposed between said cover member and said translucency sealing member.

3. A light emitting device as set forth in claim 2, wherein said light emitting device comprises a wavelength selection filter layer configured to allow a transmission of the light emitted from said LED chip and to reflect the light emitted from said fluorescent material of said color conversion layer,
said wavelength selection filter layer being formed on a light-outgoing surface of said translucency encapsulation member, and
said air layer being interposed between said cover member and said wavelength selection filter layer.

4. A light emitting device as set forth in claim 2, wherein said translucency encapsulation member is made of glass.

5. A light emitting device as set forth in claim 1, wherein said light emitting device comprises a wavelength selection filter layer configured to allow a transmission of the light emitted from said LED chip and to reflect the light emitted from said fluorescent material of said color conversion layer,
said color conversion layer being superposed on said light-outgoing surface of said cover member, and
said wavelength selection filter layer being superposed on said light-incoming surface of said cover member.

6. A light emitting device as set forth in claim 1, wherein said color conversion layer includes a translucency coat configured to coat said fluorescent material,
said translucency coat having a refractive index in the range of a refractive index of said fluorescent material to a refractive index of said translucency material.

7. A light emitting device as set forth in claim 1, wherein said mounting substrate includes a dielectric substrate where a patterned conductor electrically connected to said LED chip is formed and a heat conductive member extending through said dielectric substrate in a thickness direction thereof,
said heat conductive member being made of a material higher in heat conductivity than said dielectric substrate, and
said color conversion layer being thermally coupled to said heat conductive member.

8. A light emitting device as set forth in claim 1, wherein said light emitting device comprises a reflective member made of a material higher in reflectance than said mounting substrate,
said reflective member being interposed between said mounting substrate and an edge of each said cover member and said color conversion layer adjacent to said mounting substrate.

* * * * *